(12) United States Patent
Brewer

(10) Patent No.: US 8,736,082 B1
(45) Date of Patent: May 27, 2014

(54) KEY STRUCTURE AND EXPANSION ENHANCED ALIGNMENT OF SELF-ASSEMBLED MICROSTRUCTURES

(75) Inventor: Peter D. Brewer, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 629 days.

(21) Appl. No.: 12/258,407

(22) Filed: Oct. 25, 2008

(51) Int. Cl.
H01L 23/544 (2006.01)

(52) U.S. Cl.
USPC ............... 257/797; 257/E23.179; 438/401; 438/462

(58) Field of Classification Search
USPC ............... 257/797, E23.179; 438/401, 462
See application file for complete search history.

(56) References Cited

U.S. PATENT DOCUMENTS

| | | | | |
|---|---|---|---|---|
| 4,391,034 | A | * | 7/1983 | Stuby .......................... 118/504 |
| 4,731,041 | A | * | 3/1988 | Ziegler ......................... 446/115 |
| 5,283,205 | A | * | 2/1994 | Sakamoto .................... 438/694 |
| 5,532,520 | A | * | 7/1996 | Haraguchi et al. ........... 257/797 |
| 5,545,291 | A | | 8/1996 | Smith et al. |
| 5,556,808 | A | | 9/1996 | Williams et al. |
| 5,783,856 | A | | 7/1998 | Smith et al. |
| 5,859,478 | A | * | 1/1999 | Hagi ............................. 257/797 |
| 5,904,545 | A | | 5/1999 | Smith et al. |
| 6,657,289 | B1 | | 12/2003 | Craig et al. |
| 6,946,322 | B2 | | 9/2005 | Brewer |
| 7,018,575 | B2 | | 3/2006 | Brewer et al. |
| 7,223,635 | B1 | | 5/2007 | Brewer |
| 7,253,091 | B2 | | 8/2007 | Brewer et al. |
| 7,351,660 | B2 | | 4/2008 | Brewer et al. |
| 8,288,877 | B1 | | 10/2012 | Brewer |
| 2003/0174879 | A1 | * | 9/2003 | Chen ............................ 382/151 |
| 2004/0061200 | A1 | | 4/2004 | Iwamatsu et al. |
| 2007/0252289 | A1 | | 11/2007 | Brewer |
| 2009/0162004 | A1 | | 6/2009 | Johnson et al. |

OTHER PUBLICATIONS

USPTO Office Action, mailed May 26, 2011 for U.S. Appl. No. 12/258,408, filed Oct. 25, 2008, Inventor Peter D. Brewer.

* cited by examiner

Primary Examiner — Tom Thomas
Assistant Examiner — Christopher M Roland
(74) Attorney, Agent, or Firm — Christopher R. Balzan, Esq.

(57) ABSTRACT

In various embodiments, an assembly having a microstructure is provided, the device includes a cylindrical capture receptacle associated with a substrate, the capture receptacle comprising of a material having an expansion coefficient and comprising alignment structures having alignment projections extending inward from a periphery of the cylindrical capture receptacle. In one embodiment, the projections include a large width alignment projection and plurality of small width alignment projections. A plurality of medium width alignment projections also may be provided. A cylindrical key is associated with the microstructure and has a smaller circumference than the cylindrical capture receptacle and is comprised of a material having an expansion coefficient greater than the expansion coefficient of the cylindrical capture receptacle. The cylindrical key includes alignment receptacles spaced about a periphery of the cylindrical base to receive corresponding alignment projections. The alignment receptacles may include a large width alignment projection receptacle and a plurality of small alignment projection receptacles. A plurality of medium width alignment projection receptacles also may be provided.

23 Claims, 3 Drawing Sheets

KEY STRUCTURE AND EXPANSION ENHANCED ALIGNMENT OF SELF-ASSEMBLED MICROSTRUCTURES

CROSS REFERENCE TO RELATED APPLICATION

The present application is related to copending U.S. Application entitled ACTUATOR ENHANCED ALIGNMENT OF SELF-ASSEMBLED MICROSTRUCTURES, by Brewer et al., filed on a date even herewith, herein incorporated by reference in its entirety.

BACKGROUND

In wafer scale integrated circuits, separate component chips may be individually integrated with a host wafer using any of several established methods for chip level integration.

The alignment accuracy is a critical parameter in determining the utility of this technology. The accuracy of alignment directly impacts the integration densities, interconnect line widths and pitches, and the ability to fabricate 3D stacks of chips. Furthermore, in cooperative radiating or detecting systems, alignment is critical to the functionality of the system.

To insure proper placement and registration of the microstructures, the microstructures are formed as geometric blocks and recesses are etched from the wafer to provide receptacle sites with geometric profiles that are complementary to the profiles of the blocks. One example is shown in U.S. Pat. No. 5,545,291, by Smith et al., entitled METHOD FOR FABRICATING SELF-ASSEMBLING MICROSTRUCTURES, herein incorporated by reference in its entirety. Fluidic self-assembly may be used to integrate the individual device microstructures into receptacle sites on host electronic circuits using a liquid medium for transport. Placement and registration of the device microstructures into receptacles on a substrate carrying electronic microcircuits is controlled by shape recognition or by selective chemical adhesion or both.

Other examples of microstructure placement techniques and structures include U.S. Pat. No. 7,223,635 by Brewer, entitled ORIENTED SELF-LOCATION OF MICROSTRUCTURES WITH ALIGNMENT STRUCTURES; and U.S. Pat. No. 7,018,575, by Brewer et al., entitled METHOD FOR ASSEMBLY OF COMPLEMENTARY—SHAPED RECEPTACLE SITE AND DEVICE MICROSTRUCTURES; both herein incorporated by reference in their entireties. Further examples may be found in U.S. Pat. Nos. 6,946,322 and 5,783,856, herein incorporated by reference.

SUMMARY

In various embodiments, a device having a microstructure is provided, the device includes a capture receptacle associated with a substrate, the capture receptacle comprising of a material having an expansion coefficient and comprising alignment structures having alignment projections extending inward from a periphery of the capture receptacle. In one embodiment, the projections include a large width alignment projection and a plurality of small width alignment projections. A plurality of medium width alignment projections also may be provided in some embodiments. A key is associated with the microstructure and has a smaller circumference than the capture receptacle and is comprised of a material having an expansion coefficient greater than the expansion coefficient of the capture receptacle. The cylindrical key includes alignment receptacles spaced about a periphery of the cylindrical base to receive corresponding alignment projections. The alignment receptacles may include a large width alignment projection receptacle and a plurality of small alignment projection receptacles. A plurality of medium width alignment projection receptacles also may be provided in some embodiments.

In various embodiments, a device having a microstructure is provided, which includes a capture receptacle associated with a substrate and having alignment structures comprising groups of tabs extending inward from a periphery of the capture receptacle. The groups of tabs include a large width tab, two adjacent medium width tabs, and three adjacent small width tabs. The a key is associated with the microstructure and has a smaller circumference than the capture receptacle. The key includes alignment receptacles spaced in groups about a periphery of the base. The groups of alignment receptacles include a large width tab receptacle, two adjacent medium width tab receptacles; and three adjacent small width tab receptacles.

In various embodiments, a microstructure alignment system is provided, which includes a capture receptacle having spaced tabs extending inward from a periphery of the capture receptacle, a key sized to fit within the capture receptacle and comprising tab receptacles spaced about a periphery of the key. The generally cylindrical key has a material having a thermal expansion coefficient greater than a coefficient of expansion of the capture receptacle and is constructed such that expansion of the key material causes the tab receptacles to contact the spaced tabs so as to align the key within the capture receptacle.

BRIEF DESCRIPTION OF THE DRAWINGS

The features and advantages of the present invention will be better understood with regard to the following description, appended claims, and accompanying drawings where:

DESCRIPTION

Figure 1:
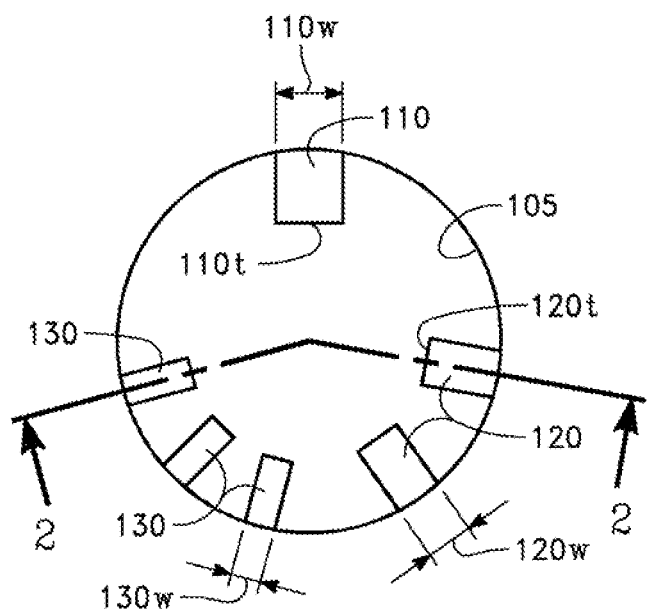
FIG. 1 is a simplified illustration showing a top view of an improved capture and alignment receptacle.

Self-assembly methods can potentially dramatically lower the costs of electronically steered antennas, mm-wave imaging systems, and MMIC technology. In areas such as phased array antennas, CMOS, low cost MMIC technology, and millimeter wave imaging, the alignment accuracy of components that are assembled using self-assembly or other techniques such as automated placement, can be critically important. The alignment accuracy is a critical parameter in determining the utility of this technology since it sets the design rules for the integration process. The accuracy of alignment directly impacts the integration densities, interconnect line widths and pitches, and the ability to fabricate 3D stacks of chips.

Precise registration and alignment of a self-assembly structure is difficult to obtain with current systems. Prior U.S. Pat. Nos. 6,946,322, 5,545,291, 5,783,856, and 5,904,545, herein incorporated by reference, describe methods for fabricating self-assembling microstructures. The self-assembling microstructures are material blocks, or device and IC components that are either geometrically shaped or have external alignment keys for assembly and positioning.

In the case of the shaped blocks, these fit into recessed regions of a substrate and become integral with the substrate. The fabrication of the geometrically shaped microstructure utilizes crystallogaphically selective wet-chemical etching to tailor the sidewall profile of the microstructures. It has been realized by the present inventor that this approach has a number of disadvantages including: limited selection of sidewall profiles (difficult to implement for extremely thin device microstructures), poor orientation capability—limited selection of geometric shapes (IC or device design are typically to squares or rectangles), poor use of device and circuit area due to shaping of microstructure, limited applicability to materials that are difficult to etch ($Al_2O_3$, SiC, GaN, etc.), and poor compatibility of etch chemistry to shape the microstructure with fabricated devices and circuits on the microstructure.

In the case of the components with external alignment keys, the alignment accuracy is limited by the mechanical tolerance between the key and the complimentary shaped receptacle. There is a tradeoff between the optimum assembly throughput and the precision of the alignment. Typically, to achieve the highest assembly throughput the mechanical fit must be loose.

Some implementations provide a means for improving the alignment accuracy of self-assembled keyed device or integrated circuit components or other high throughput assembly means (i.e. pick and place). In various implementations and embodiments, improved alignment is to be achieved without compromising the assembly throughput or initial orienting process. Various implementations and embodiments may be utilized to improve assembly and transfer of integrated devices or integrated circuit components on a host circuit, as well as the processes for keying the components and making the complementary receptacle arrays.

To facilitate manufacturing, it is desirable to achieve precise alignment without compromising the assembly throughput, and preferably without significantly changing the orientation process. One way to achieve this is to improve the alignment mechanism of the self-assembled device or IC microstructures with their complementary shaped host receptacles. The improved microstructures ultimately will be transferred and integrated into host circuits.

As described in further detail below, various implementations and embodiments employ components that have alignment key structures and receptacles that are complementary shaped. In one embodiment of the invention, the thermal expansion difference between the key structure and the receptacle is used to gain an advantage in the mechanical tolerance between the key and receptacle by heating. This solves a long-standing problem of how to quickly assemble loosely fitting parts and achieve very high levels of alignment accuracy.

FIGS. 1-6

FIG. 1 is a simplified illustration showing a top view of an improved capture and alignment receptacle 105, typically formed in a substrate (not shown). As used herein, the term substrate refers to any material in which one or more capture receptacles 105 may be formed. Thus, it may be a base material, i.e. a wafer or the like, or, it may be one or more layers on a base material or carrier (not shown).

In the embodiment of FIG. 1, the receptacle 105 is a cylindrical cavity with large, medium, and small alignment projections 110, 120, and 130, respectively, extending inwardly. Projection 110 is a single tab-like projection 110 with a large width 110w relative to the other projections 120 and 130. Two tab-like projections 120 have a medium width 120 was compared to the other projections 110 and 130. Three tab-like projections 130 have a small width 130 was compared to the other projections 110 and 120.

The projections 110, 120, and 130 are spaced about the periphery of the receptacle 105 and are grouped by corresponding width, i.e. large, medium, and small. The two medium width 120w projections 120 are located adjacent to each other, and the three small width 130w projections 130 are located adjacent to each other.

Referring to FIG. 1, in various embodiments, the sum of widths 130w of two adjacent projections of the small width projections 130 and a separation distance between the two adjacent projections of the small width projections 130 is greater than a width 120w of one of the medium width projections 120. Furthermore, in various embodiments, the sum of the widths 120w of the two medium width projections 120 and a separation distance between the two medium width projections 120 is greater than a width 110w of the large alignment projection 110. In various embodiments, the sum of the widths 130w of the three small width projections 130 and a separation distance between the three small width projections 130 is greater than a width 110w of the large width projection 110. Also, in various embodiments, the sum of widths 130w of two adjacent projections of the three small width projections 130 and a separation distance between the two adjacent projections of the three small width projections 130 is greater than a width 120w of one of the medium width projections 120.

Figure 2:
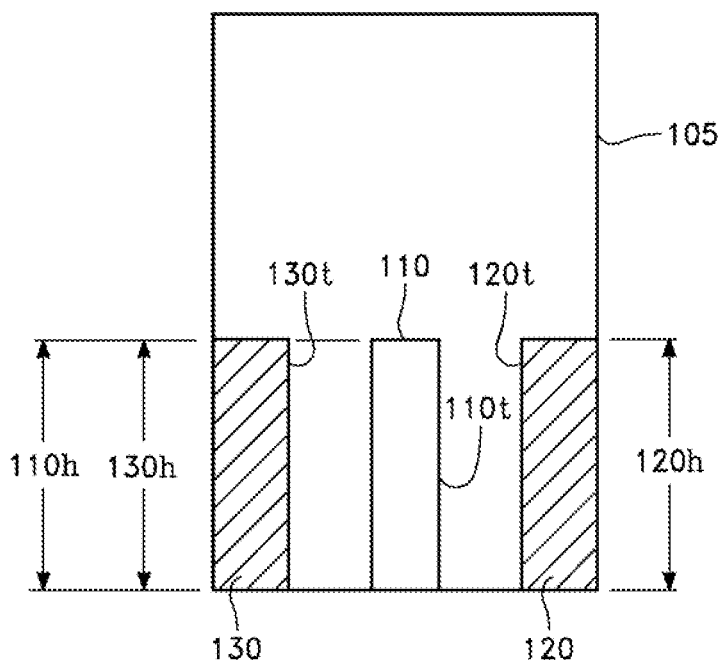
FIG. 2 is a simplified illustration showing a cross sectional side view of the receptacle along the 2-2 line of FIG. 1.

FIG. 2 is a simplified illustration showing a cross sectional side view of the receptacle 105 along the 2-2 line of FIG. 1. In this embodiment, the large width projection 110, the medium width projections 120, and the small width projections 130 all have the same height, 110h, 120h, and 130h, respectively.

Figure 3:
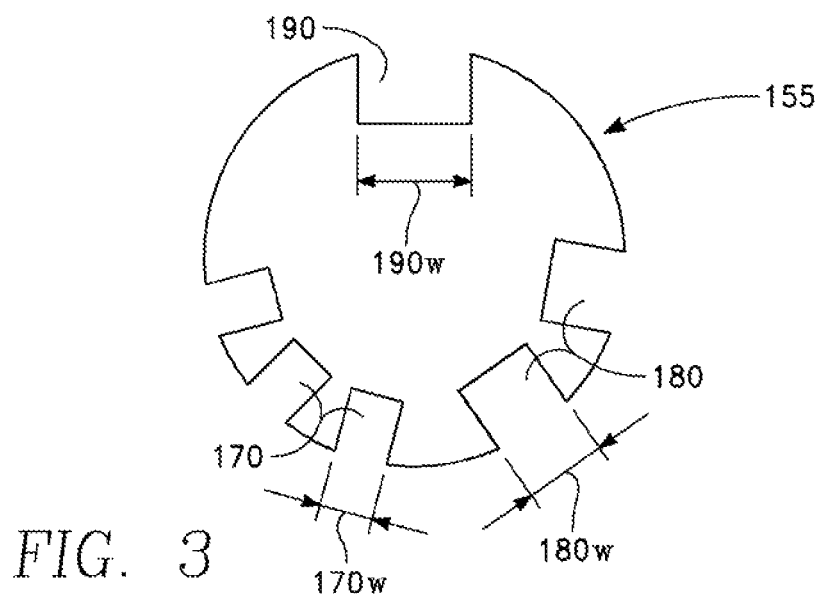
FIG. 3 is a simplified illustration showing a cross sectional top view of a key constructed to mate with the receptacle of FIG. 1.

FIG. 3 is a simplified illustration showing a cross sectional top view of a key 155 constructed to mate with the receptacle 105 of FIG. 1. The key 155 is generally cylindrical with large, medium, and small width alignment projection receptacles 190, 180, and 170, respectively. The large, medium, and small width alignment projection receptacles 190, 180, and 170 are longitudinal channels or grooves in the key 155, located about a periphery of the key 155. Projection receptacle 190 has a large width 190w relative to the other projection receptacles 180 and 170. The two projection receptacles 180 have a medium width 180w as compared to the other projections 190 and 170. Three projection receptacles 170 have a small width 170 was compared to the other projection receptacles 190 and 180.

The projection receptacles 190, 180, and 170 are spaced about the periphery of the key 155 and are grouped by corresponding width, i.e. large, medium, and small, to correspond with the projections 110, 120, and 130 of the receptacle 105 (of FIG. 1).

Referring to FIG. 3, in some embodiments, the sum of the widths 180w of the two adjacent medium width tab receptacles 180 and a separation distance between the two medium width tab receptacles 180 is greater than a width 190w of the large width tab receptacle 190. Similarly, in some embodiments, the sum of the widths 170w of the three adjacent small width tab receptacles 170 and a separation distance between the three adjacent small width tab receptacles 170 is greater than a width 190w of the large width tab receptacle 190. Also, in some embodiments, the sum of widths 170w of two adjacent tab receptacles of the three small width tab receptacles 170 and a separation distance between the two adjacent tab receptacles of the three small width tab receptacles 170 is greater than a width 180w of one of the medium width tab receptacles 180.

Photolithographic methods may be used to fabricate alignment key structures on circuit and device-sized components for shape matching self-assembly. These "keyed" components may be designed to match corresponding receptacle 105 sites on a patterned assembly template (not shown). The alignment key enables close positioning and orientation of arrays of microstructures without shaping the microstructures themselves. The key 155 structures may be designed for 100 micron sized devices (not shown).

In one method for fabricating the alignment key 155 structure on small device structures, a photoresist process is used. The key 155 fabrication uses a single-step process in which thick SU-8 (a negative photo-epoxy resist) is applied and exposed to pattern the shape of the key 155. After exposure, the SU-8 film is developed, the resulting structure undergoes a final hard-bake process to form the key 155 on the device (not shown).

Figure 4:
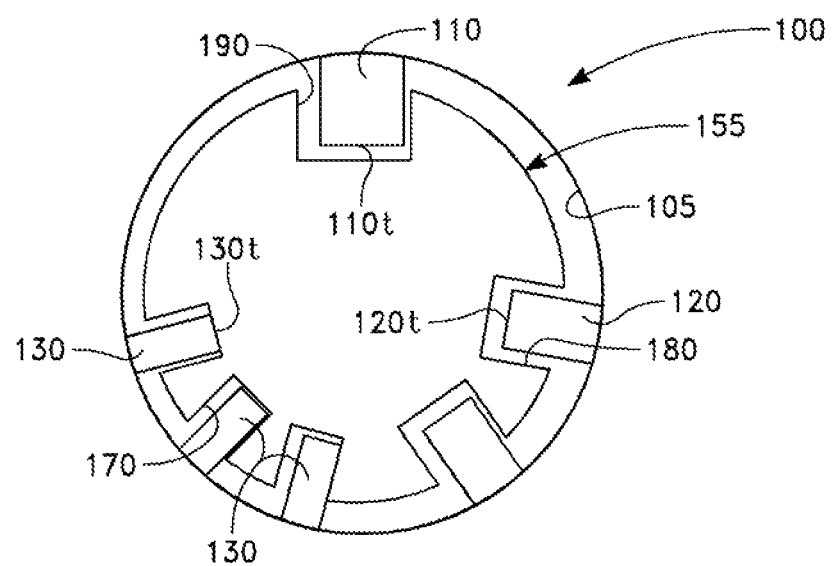
FIG. 4 is a simplified illustration showing a cross sectional top view of a microstructure alignment system with the key in the receptacle.

FIG. 4 is a simplified illustration showing a cross sectional top view of a microstructure alignment system 100 with the key 155 in the receptacle 105. The circular cross section of the receptacle 105 allows easy capture of the key 155. Orientation of the key 155 is accomplished by engaging the projections 110, 120 and 130. The key 155 is captured by the receptacle 105 and oriented until it engages the alignment projections 110, 120, and 130. The mating of the projections 110, 120, and 130, with the corresponding projection receptacles 190, 180, and 170 fix the orientation of the key, along with any associated device. The projection receptacles 190, 180, and 170 (and projections 110, 120, and 130) are sized and spaced so that the key 155 can not align using the wrong projections 110, 120, or 130.

To engage, the key 155 drops into the receptacle 105 and is oriented until the projections 110, 120, and 130 engage the projection receptacles 190, 180, and 170. This may be done by causing the key to rotate, such as by vibrating of the system, or by fluid motion.

Figure 5:
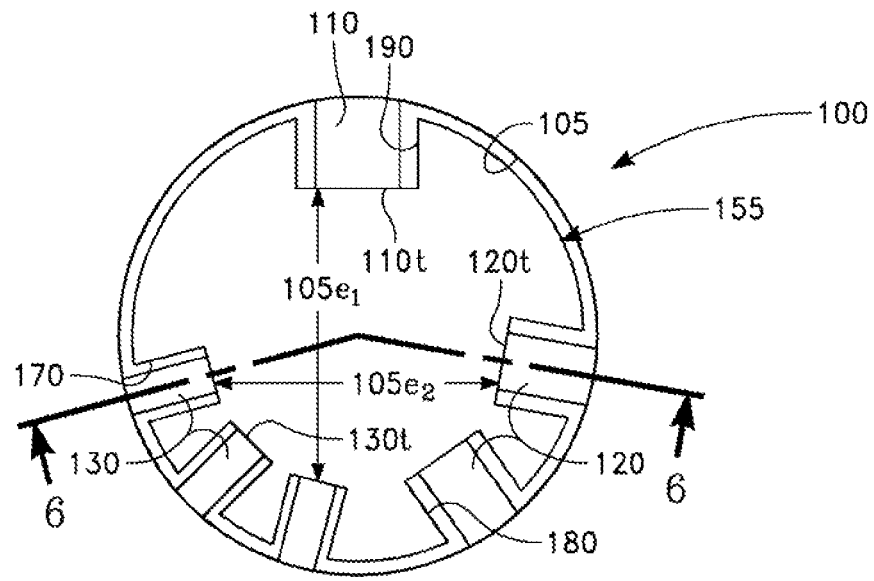
FIG. 5 is a simplified illustration showing the key aligned within the receptacle.

FIG. 5 is a simplified illustration showing the key 155 aligned within the receptacle 105. When the key 155 swells within the receptacle 105, it creates a tighter fit, which improves precision. In some implementations, a final alignment is achieved by heating the keyed component (not shown) that is oriented in the receptacle 105. The large difference between the thermal expansion coefficients of the SU-8 ($112 \times 10^{-6\circ}$ C.$^{-1}$) key 155 and the silicon ($2.6 \times 10^{-6\circ}$ C.$^{-1}$) receptacle material forms the basis of the enhanced alignment of the positioned components in the receptacles. This difference in the thermal expansion of a factor of approximately 40 allows large dimensional changes to be induced during moderate heating (150° C.). For example, a 1 millimeter key will undergo approximately a 16.8 micron expansion in diameter during a 150 degree Celsius heating, whereas the silicon receptacle will decrease in cross section diameter by approximately 0.4 microns. These dimensional changes are enhancing the alignment of a keyed component (not shown), which is captured and oriented in a receptacle 105, to the receptacle 105 itself.

In some embodiments, the heating process may be carried out solely for alignment, or as part of a solder process so that the component (not shown) is simultaneously aligned, secured, and electrically connected to a substrate (not shown).

There are a number of possible mechanisms that can induce changes between the shape of a key 105 and a receptacle 155. These include but are not limited to the following: thermal expansion differences between the key and the receptacle materials, swelling of the key structure by solvent uptake, solvent state change, piezoelectric, piezomagnetic, shape memory alloy or polymer expansion, etc. Thus, the key 155 and/or receptacle 105 may comprise, or employ, various materials that expand, to take up the space between the key receptacles 170, 180, and 190, and the receptacle projections 130, 120, and 110. After alignment, the key 155, or attached device 150, may be bonded, or otherwise secured, in place.

Various embodiments are able to provide more accurate final alignment because the projection receptacles 190, 180, 170 are located at a periphery of the key 155. Thus, the projections 110, 120, and 130 contact the key 155 at a periphery of the key 155, shown in FIG. 5. This type of alignment mechanism allows the expansion of the key 155 to expand uninterrupted across the central span $105e_1$ or $105e_2$ of the key 155, rather than having intermediate contact points to subsections within the central region. The number of gaps between the key 155 and the receptacle 105 is two, one on either side of the span $105e_1$ or $105e_2$, which increases the expansion length. Because the coefficient of expansion times the span length provides the expansion, locating the contact points 110t, 120t, and 130t at a periphery maximizes this effect, improving precision.

Figure 6:
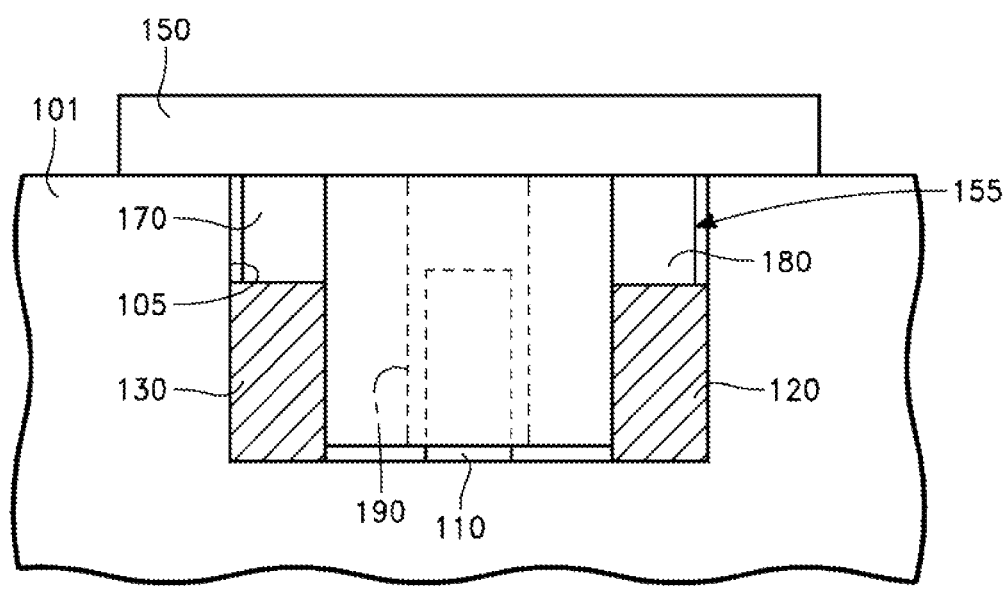
FIG. 6 shows a cross sectional view along the 6-6 line of FIG. 5 illustrating one possible embodiment of a microstructure assembly.

As illustrated in FIG. 6, using the different width alignment projections, i.e. large, medium, and small, after capture by the receptacle 105, inhibits skewing and/or wedging of the key 155 within the receptacle 105 so that it does not seat cockeyed within the receptacle 105, and allows proper seating of the device 150. In some embodiments, engagement of the projections 110, 120, and 130 with the corresponding projection receptacles 190, 180, and 170 provides alignment within 5 microns of final alignment.

The summation of the expansion of the key 155 across the central span $105e_1$ or $105e_2$, facilitated by locating the contact points 110t, 120t, and 130t at the periphery of the key 155, further enhances and allows greater precision alignment than is otherwise achievable with conventional alignment means. Thus, in some embodiments, alignments of below 1 micron are achievable.

In some embodiments (not shown) it is possible to have key material expand around a protruding "receptacle" projection.

FIG. 6 shows a cross sectional view along the 6-6 line of FIG. 5 illustrating one possible embodiment of a microstructure assembly. The key 155 is associated with a microstructure device 150, which is seated on a substrate 101. As used herein, the term substrate 101 refers to any material in which one or more capture receptacles 105 may be formed. Thus, a substrate as used herein, may be a base material, i.e. a wafer or the like, or, it may be one or more layers on a base material or carrier. In some embodiments, a microstructure assembly may include many devices 150, which may be aligned within respect to each other within an array.

The example embodiments herein are not intended to be limiting, various configurations and combinations of features are possible. Having described this invention in connection with a number of embodiments, modification will now certainly suggest itself to those skilled in the art. As such, the invention is not limited to the disclosed embodiments, except as required by the appended claims.

What is claimed is:

1. A microstructure assembly comprising:
   a) a capture receptacle associated with a substrate, the capture receptacle comprising a material having an expansion coefficient, the capture receptacle comprising a cavity and comprising alignment structures in the cavity having alignment projections recessed within the cavity and extending inward from a periphery of the capture receptacle, the projections comprising:
      i) a large width alignment projection; and
      ii) a plurality of small width alignment projections;
   b) a key associated with a microstructure device, the key being sized to fit within the capture receptacle and being comprised of a material having an expansion coefficient greater than the expansion coefficient of the capture receptacle, the key comprising alignment receptacles spaced about a periphery and flush with an outer edge of the key to receive corresponding alignment projections, the alignment receptacles comprising:
      i) a large width alignment projection receptacle; and
      ii) a plurality of small width alignment projection receptacles;
   c) wherein the key is comprised of a material having a thermal expansion coefficient greater than a thermal expansion coefficient of the capture receptacle; and
   d) wherein the capture receptacle further comprises a plurality of medium width alignment projections, and wherein the key further comprises a plurality of medium width alignment projection receptacles.

2. The device of claim 1, wherein a sum of widths of two adjacent projections of the plurality of small width projections and a separation distance between the two adjacent projections of the plurality of small width projections is greater than a width of one of the plurality of medium width projections.

3. The device of claim 1, wherein the plurality of small width alignment projections comprises a group of three small width projections and the plurality of medium width alignment projections comprises a group of two medium width projections.

4. The device of claim 3, wherein a sum of the widths of the two medium width projections and a separation distance between the two medium width projections is greater than a width of the large alignment projection.

5. The device of claim 3, wherein a sum of the widths of the three small width projections and a separation distance between the three small width projections is greater than a width of the large width projection.

6. The device of claim 3, wherein a sum of widths of two adjacent projections of the three small width projections and a separation distance between the two adjacent projections of the three small width projections is greater than a width of one of the medium width projections.

7. The device of claim 1, wherein a sum of the widths of the plurality of medium width projections and a separation distance between the plurality of medium width projections is greater than a width of the large alignment projection.

8. The device of claim 1, wherein a sum of the widths of the plurality of small width projections and a separation distance between the plurality of small width projections is greater than a width of the large width projection.

9. A microstructure assembly comprising:
   a) a cylindrical capture receptacle associated with a substrate, the capture receptacle having alignment structures comprising groups of tabs extending inward from a periphery of the capture receptacle, the groups of tabs comprising:
      i) a large width tab;
      ii) two adjacent medium width tabs; and
      iii) three adjacent small width tabs; and
   b) a cylindrical key associated with a microstructure device, the cylindrical key having a smaller circumference than the cylindrical capture receptacle, the cylindrical key comprising alignment receptacles spaced in groups about a periphery of the cylindrical key, the groups of alignment receptacles comprising:
      i) a large width tab receptacle;
      ii) two adjacent medium width tab receptacles; and
      iii) three adjacent small width tab receptacles.

10. The device of claim 9, wherein the cylindrical key comprises a material having a thermal expansion coefficient greater than a thermal expansion coefficient of the cylindrical capture receptacle.

11. A microstructure alignment system comprising:
    a) a capture receptacle comprising a cavity, and comprising spaced tabs recessed within the cavity extending inward from a periphery of the capture receptacle;
    b) a key sized to fit within the capture receptacle and comprising tab receptacles spaced about a periphery and flush with an outer edge of the key;
    c) the key comprising a material having a thermal expansion coefficient greater than a coefficient of expansion of the capture receptacle and being constructed such that expansion of the key material causes the tab receptacles to contact the spaced tabs so as to align the key within the capture receptacle;
    d) wherein the spaced tabs comprise groups of tabs sized and arranged such that the key is guided into a specific orientation into the capture receptacle by corresponding tab receptacles;
    e) wherein the spaced tabs comprise a large width alignment tab and a plurality of grouped small width alignment tabs; and
    f) wherein the spaced tabs comprise a plurality of grouped medium alignment tabs.

12. A microstructure comprising an alignment key, the alignment key comprising:
    a) a generally cylindrical key comprising a plurality of tab receptacles spaced about a periphery of the key, the plurality of tab receptacles comprising:
       i) a large width tab receptacle;
       ii) two adjacent medium width tab receptacles; and
       iii) three adjacent small width tab receptacles; and
    b) the generally cylindrical key comprising a material having a thermal expansion coefficient and being sized and configured to receive a plurality of corresponding tabs extending from a capture receptacle so that expansion of the key material within the capture receptacle causes the plurality of tab receptacles to contact the corresponding plurality of tabs so as to align the generally cylindrical key within the capture receptacle.

13. The microstructure of claim 12, wherein a sum of the widths of the two adjacent medium width tab receptacles and a separation distance between the two medium width tab receptacles is greater than a width of the large width tab receptacle.

14. The microstructure of claim 12, wherein a sum of the widths of the three adjacent small width tab receptacles and a separation distance between the three adjacent small width tab receptacles is greater than a width of the large width tab receptacle.

15. The microstructure of claim 12, wherein a sum of widths of two adjacent tab receptacles of the three small width tab receptacles and a separation distance between the two adjacent tab receptacles of the three small width tab receptacles is greater than a width of one of the medium width tab receptacles.

16. A microstructure assembly comprising:
  a) a capture receptacle associated with a substrate, the capture receptacle comprising a material having an expansion coefficient, the capture receptacle comprising a cavity and comprising alignment structures in the cavity having alignment projections recessed within the cavity and extending inward from a periphery of the capture receptacle, the projections comprising:
    i) a large width alignment projection; and
    ii) a plurality of small width alignment projections;
  b) a key associated with a microstructure device, the key being sized to fit within the capture receptacle and being comprised of a material having an expansion coefficient greater than the expansion coefficient of the capture receptacle, the key comprising alignment receptacles spaced about a periphery of the key to receive corresponding alignment projections, the alignment receptacles comprising:
    i) a large width alignment projection receptacle; and
    ii) a plurality of small width alignment projection receptacles;
  c) wherein the key is comprised of a material having a thermal expansion coefficient greater than a thermal expansion coefficient of the capture receptacle; and
  d) wherein the capture receptacle further comprises a plurality of medium width alignment projections, and wherein the key further comprises a plurality of medium width alignment projection receptacles.

17. The device of claim 16, wherein a sum of widths of two adjacent projections of the plurality of small width projections and a separation distance between the two adjacent projections of the plurality of small width projections is greater than a width of one of the plurality of medium width projections.

18. The device of claim 16, wherein the plurality of small width alignment projections comprises a group of three small width projections and the plurality of medium width alignment projections comprises a group of two medium width projections.

19. The device of claim 18, wherein a sum of the widths of the two medium width projections and a separation distance between the two medium width projections is greater than a width of the large alignment projection.

20. The device of claim 18, wherein a sum of the widths of the three small width projections and a separation distance between the three small width projections is greater than a width of the large width projection.

21. The device of claim 18, wherein a sum of widths of two adjacent projections of the three small width projections and a separation distance between the two adjacent projections of the three small width projections is greater than a width of one of the medium width projections.

22. The device of claim 16, wherein a sum of the widths of the plurality of medium width projections and a separation distance between the plurality of medium width projections is greater than a width of the large alignment projection.

23. A microstructure alignment system comprising:
  a) a capture receptacle comprising a cavity, and comprising spaced tabs recessed within the cavity extending inward from a periphery of the capture receptacle;
  b) a key sized to fit within the capture receptacle and comprising tab receptacles spaced about a periphery of the key;
  c) the key comprising a material having a thermal expansion coefficient greater than a coefficient of expansion of the capture receptacle and being constructed such that expansion of the key material causes the tab receptacles to contact the spaced tabs so as to align the key within the capture receptacle;
  d) wherein the spaced tabs comprise groups of tabs sized and arranged such that the key is guided into a specific orientation into the capture receptacle by corresponding tab receptacles;
  e) wherein the spaced tabs comprise a large width alignment tab and a plurality of grouped small width alignment tabs; and
  f) wherein the spaced tabs comprise a plurality of grouped medium alignment tabs.

* * * * *